United States Patent
Park et al.

(10) Patent No.: US 12,436,463 B2
(45) Date of Patent: Oct. 7, 2025

(54) APPARATUS FOR TREATING SUBSTRATE AND METHOD FOR TREATING A SUBSTRATE

(71) Applicant: SEMES CO., LTD., Cheonan-si (KR)

(72) Inventors: Min Jung Park, Cheonan-si (KR); Soo Bin Yong, Cheonan-si (KR); Jae Hoon Park, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 18/333,185

(22) Filed: Jun. 12, 2023

(65) Prior Publication Data

US 2024/0192602 A1    Jun. 13, 2024

(30) Foreign Application Priority Data

Dec. 12, 2022    (KR) ........................ 10-2022-0172461

(51) Int. Cl.
*G03F 7/16*    (2006.01)
*G03F 1/56*    (2012.01)
*H01L 21/02*    (2006.01)
*H01L 21/47*    (2006.01)
*H01L 21/67*    (2006.01)

(52) U.S. Cl.
CPC ............. *G03F 7/162* (2013.01); *G03F 1/56* (2013.01); *H01L 21/02282* (2013.01); *H01L 21/47* (2013.01); *H01L 21/67034* (2013.01)

(58) Field of Classification Search
CPC ............. G03F 7/162; H01L 21/67028
See application file for complete search history.

(56) References Cited

U.S. PATENT DOCUMENTS

2008/0176410 A1* 7/2008 Muramatsu ......... H01L 21/6715
                                                            438/758
2018/0061649 A1* 3/2018 Park .................. H01L 21/30604

FOREIGN PATENT DOCUMENTS

| JP | 2008-307488 A | | 12/2008 |
|---|---|---|---|
| JP | 6690717 B2 | | 4/2020 |
| KR | 20070059912 | * | 6/2007 |
| KR | 2008/0023590 | * | 3/2008 |
| KR | 10-2016-0135903 A | | 11/2016 |
| KR | 20160135903 | * | 11/2016 |
| KR | 10-2018-0025256 A | | 3/2018 |
| KR | 101842118 B1 | | 5/2018 |
| KR | 102053495 B1 | | 12/2019 |

OTHER PUBLICATIONS

Korean Office Action dated Oct. 18, 2024 issued in Korean Patent Application No. 10-2022-0172461.

* cited by examiner

*Primary Examiner* — Tabassom Tadayyon Eslami
(74) *Attorney, Agent, or Firm* — Harness, Dickey & Pierce, P.L.C.

(57) ABSTRACT

The inventive concept provides a substrate treating method. The substrate treating apparatus includes first treating including supplying a first liquid to a rotating substrate; and second treating including supplying a second liquid to the rotating substrate after the supplying of the first liquid, and wherein a rotation speed of a substrate is changed during the supplying of the first liquid to the rotating substrate.

19 Claims, 10 Drawing Sheets

APPARATUS FOR TREATING SUBSTRATE AND METHOD FOR TREATING A SUBSTRATE

CROSS-REFERENCE TO RELATED APPLICATIONS

A claim for priority under 35 U.S.C. § 119 is made to Korean Patent Application No. 10-2022-0172461 filed on Dec. 12, 2022, in the Korean Intellectual Property Office, the entire contents of which are hereby incorporated by reference.

TECHNICAL FIELD

Embodiments of the inventive concept described herein relate to a substrate treating apparatus and method, more specifically, a substrate treating apparatus and method for supplying a liquid to a substrate.

BACKGROUND

Various processes such as a photolithography process, an etching process, an ashing process, a thin film deposition process, and a cleaning process are performed to manufacture a semiconductor element or a flat plate display panel. Among these processes, the photolithography process involves sequentially or selectively performing a coating process of supplying a photoresist liquid to a semiconductor substrate to form a coating film on a substrate surface and an exposing process of exposing a coating layer using a mask, and then a developing process of obtaining a desired pattern on the semiconductor substrate by supplying a developing liquid.

If a chemical is supplied onto a substrate on which a fine pattern with a high aspect ratio is formed, it is difficult for the chemical to penetrate between patterns. In particular, if the chemical is supplied to the substrate while rotating the substrate in a direction with an axis as a rotation axis, the chemical is filled only in a space of the pattern. An air void such as bubbles are formed in other spaces of the pattern in which the chemical cannot easily penetrate. If a large amount of air voids are formed between the patterns, a space in which the air voids are formed cannot be not filled with the chemical, and the chemical may not be uniformly coated on the substrate. This acts as a factor which hinders an efficient treatment of the substrate in subsequent processes.

SUMMARY

Embodiments of the inventive concept provide a substrate treating apparatus and method for efficiently treating a substrate.

Embodiments of the inventive concept provide a substrate treating apparatus and method for uniformly coating an entire region of a substrate with a liquid.

Embodiments of the inventive concept provide a substrate treating apparatus and method for uniformly coating a space between patterns formed on a substrate with a liquid.

Embodiments of the inventive concept provide a substrate treating apparatus and method for minimizing a generation of an air void between patterns.

The technical objectives of the inventive concept are not limited to the above-mentioned ones, and the other unmentioned technical objects will become apparent to those skilled in the art from the following description.

The inventive concept provides a substrate treating method. The substrate treating method includes first treating including supplying a first liquid to a rotating substrate; and second treating including supplying a second liquid to the rotating substrate after the supplying of the first liquid, and wherein a rotation speed of a substrate is changed during the supplying of the first liquid to the rotating substrate.

In an embodiment, the first treating includes: a main diffusing including main supplying the first liquid to the rotating substrate to coat a whole area of the substrate with the first liquid and to remove particles attached on the substrate; and a supplementary diffusing including supplementary supplying the first liquid to the rotating substrate to fill a space between patterns formed on the substrate.

In an embodiment, an average rotation speed of the substrate at the supplementary diffusing is slower than an average rotation speed of the substrate at the main diffusing.

In an embodiment, the main supplying of the first liquid of the main diffusing includes: firstly supplying the first liquid to the rotating substrate which is rotating at a first rotation speed; and secondly supplying the first liquid to the rotating substrate which is rotating at a second rotation speed, the second speed being greater than the first rotation speed.

In an embodiment, each of the first rotation speed and the second rotation speed is faster than the average rotation speed of the substrate at the supplementary diffusing.

In an embodiment, the first treating further includes: firstly drying including rotating the substrate between the main diffusing and the supplementary diffusing to remove the first liquid remaining on the substrate; stopping the rotating of the substrate after the supplementary diffusing; and secondly drying including drying the first liquid remaining on the substrate after the stopping of the rotating of the substrate.

In an embodiment, each average rotation speed of the substrate at the firstly drying and the secondly drying is greater than the first rotation speed and the second rotation speed, and wherein the average rotation speed of the substrate at the firstly drying is greater than the average rotation speed of the substrate at the secondly drying.

In an embodiment, each supply time of the first liquid to the substrate at the firstly supplying and the secondly supplying is longer than a supply time of the first liquid to the substrate at the supplementary diffusing.

In an embodiment, the first liquid is a thinner, and the second liquid is a photoresist liquid.

In an embodiment, each of the first liquid and the second liquid is supplied to a top surface of the substrate having a pattern formed thereon, and each of the first liquid and the second liquid is each supplied to a central region of the substrate.

The inventive concept provides a substrate treating method for treating a substrate having patterns formed on a top surface thereof. The substrate treating method includes firstly supplying a liquid to a rotating substrate to permeate the liquid to a space between patterns; secondly supplying the liquid to the rotating substrate to diffuse the liquid toward an edge region of the substrate; and supplementary diffusing including supplying the liquid to the rotating substrate to secondly permeate the first liquid to the space between patterns, and wherein an average rotation speed of the substrate at the firstly supplying of the liquid, an average rotation speed of the substrate at the secondly supplying of the liquid, and an average rotation speed of the substrate at the supplementary diffusing are different from one another.

In an embodiment, a rotation speed of the substrate is changed while the liquid is continuously supplied to the substrate, in a transition from the firstly supplying of the liquid to the secondly supplying of the liquid.

In an embodiment, the substrate rotates at a first rotation speed at the firstly supplying of the liquid, and the substrate rotates at a second rotation speed at the secondly supplying of the liquid, and the first rotation speed is lower than the second rotation speed.

In an embodiment, the substrate rotates at a third rotation speed at the supplementary diffusing, and the third rotation speed is lower than the first rotation speed.

In an embodiment, the first rotation speed is about 500 RPM, and the second rotation speed is about 800 RPM, and the third rotation speed is about 30 RPM.

In an embodiment, the liquid includes a thinner.

The inventive concept provides a substrate treating apparatus. The substrate treating apparatus includes a chuck rotating a substrate; a rotation driver rotating the chuck and changing a rotation speed of the chuck; a first nozzle supplying a first liquid to a substrate supported on the chuck; a second nozzle supplying a second liquid to the substrate supported on the chuck, the second liquid being different from the first liquid; and a controller configured to control the rotation driver, the first nozzle, and the second nozzle so that the second liquid is supplied to a rotating substrate after the first liquid is supplied to the rotating substrate, and the rotation speed of the chuck is changed while the first liquid is supplied to the substrate.

In an embodiment, the controller is further configured to control the first nozzle, and the rotation driver so that the first liquid is supplied to the rotating substrate to firstly permeate the first liquid to a space between patterns formed on the substrate, and then the rotation speed of the substrate is lowered and the first liquid is re-supplied to the rotating substrate to supplementarily permeate the first liquid to the space between the patterns.

In an embodiment, the controller is further configured to control the rotation driver so that the rotation speed of the chuck is changed when the first liquid is firstly permeated to the space between the patterns.

In an embodiment, the controller is further configured to control rotation driver so that during the first liquid is firstly permeated to the space between the patters the rotation speed of the chuck at a second time period is faster than a rotation speed of the chuck at a first time period, the second time period being later than the first time period.

According to an embodiment of the inventive concept, a substrate may be efficiently treated.

According to an embodiment of the inventive concept, a liquid may be uniformly coated at an entire region of a substrate.

According to an embodiment of the inventive concept, a liquid may be uniformly coated at a space between patterns formed on a substrate.

According to an embodiment of the inventive concept, an air void formed between patterns may be minimized.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
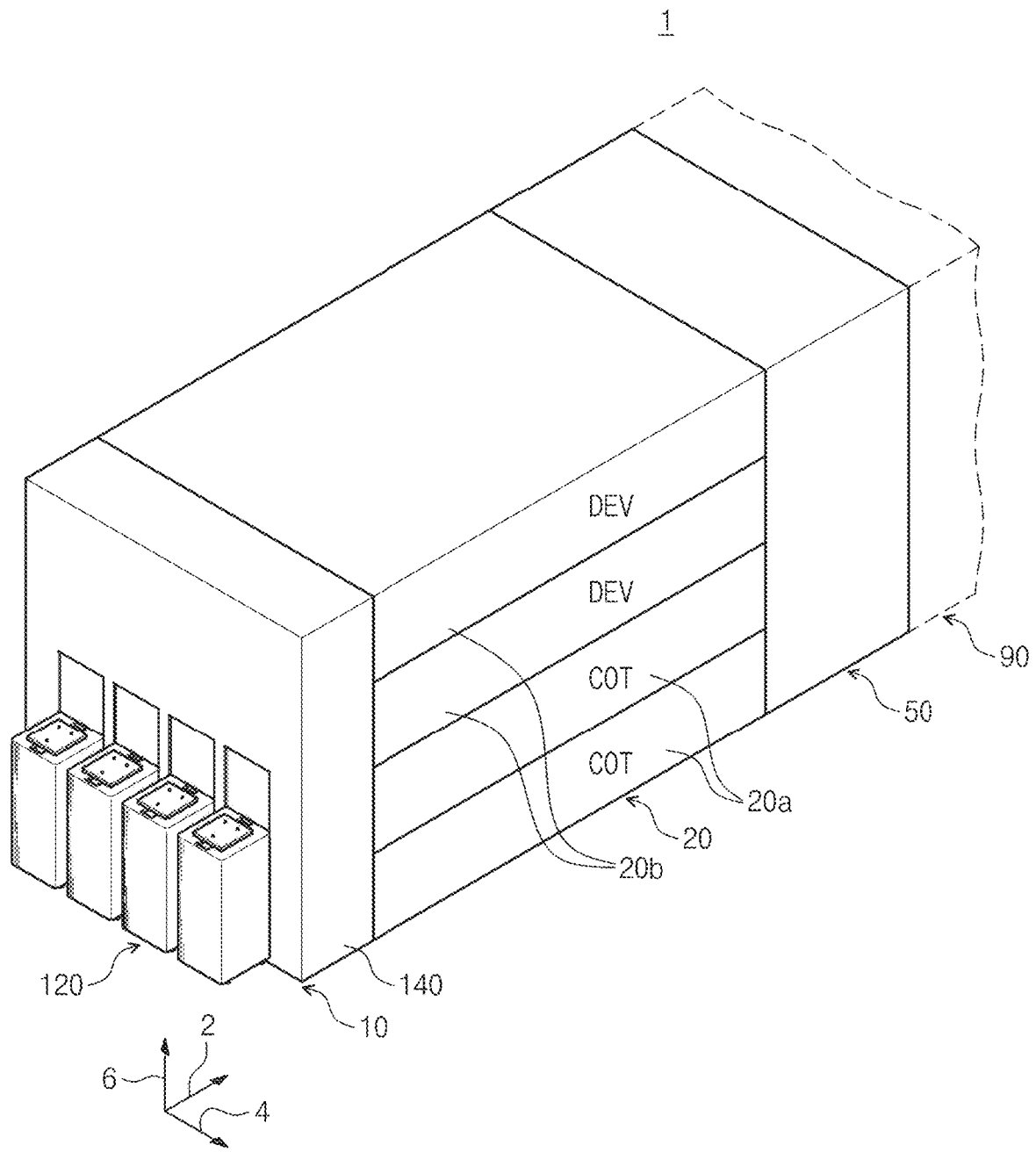
FIG. 1 is a perspective view schematically illustrating a substrate treating apparatus according to an embodiment.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be described in detail with reference to the accompanying drawings.

The substrate according to an embodiment described below will be described with a circular substrate such as a semiconductor wafer as an example. However, the inventive concept is not limited thereto, and the substrate described in an embodiment of the inventive concept may be a rectangular substrate such as a mask or a display panel.

In an embodiment of the inventive concept, a substrate treating apparatus on which at least one of a coating process for forming a coating film on a surface of a substrate by supplying a photoresist liquid such as a photoresist liquid on the substrate, an exposure process for exposing with respect to the coating film, and a developing process for forming a desired pattern on the substrate may supplying a developing liquid on the substrate, is described as an example. However, the inventive concept is not limited to the above-described example, and the substrate treating apparatus according to an embodiment may be applied to various devices performing a predetermined process of the substrate.

Figure 2:
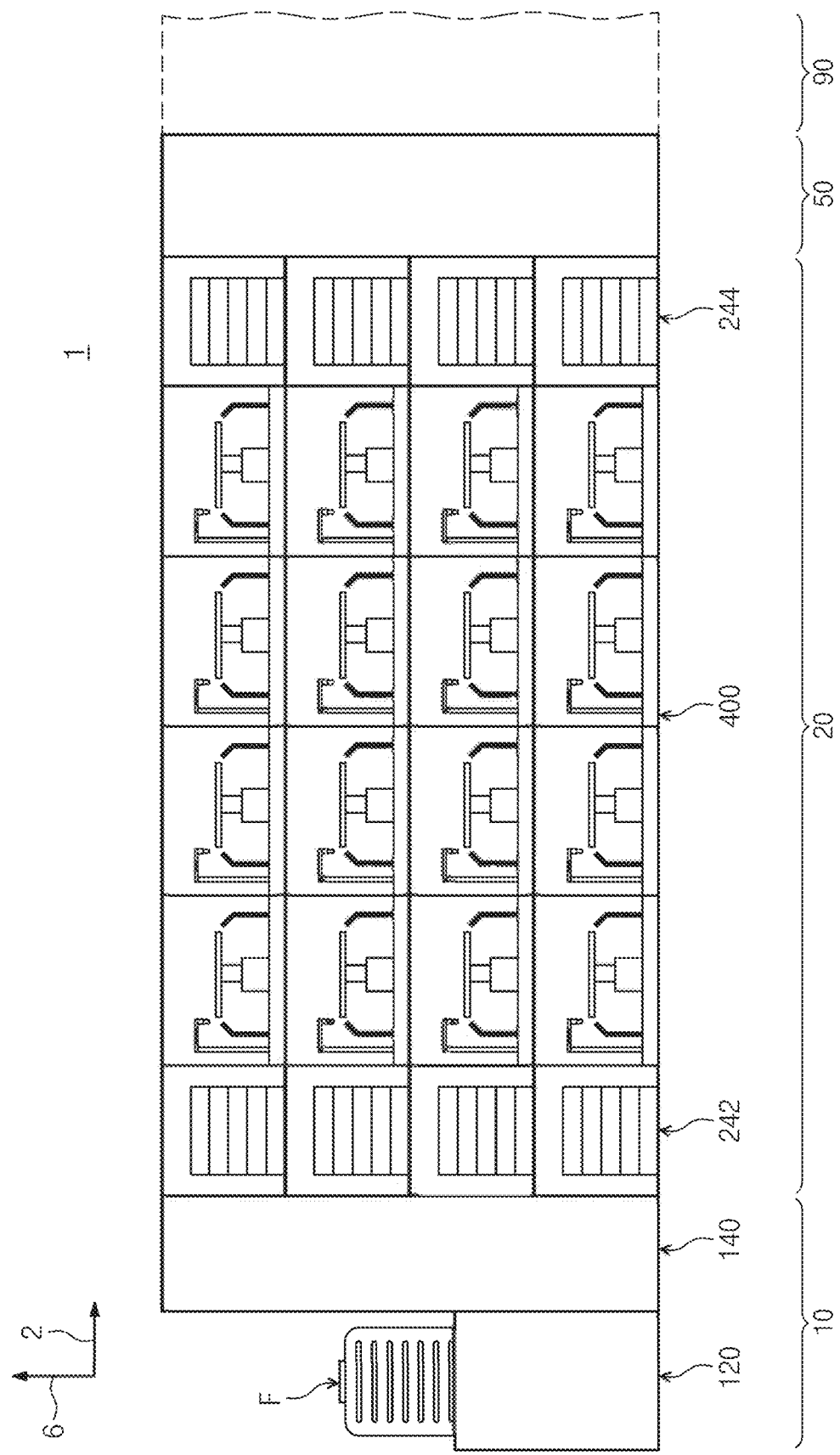
FIG. 2 is a cross-sectional view schematically illustrating a coating block or a developing block of FIG. 1.
Figure 3:
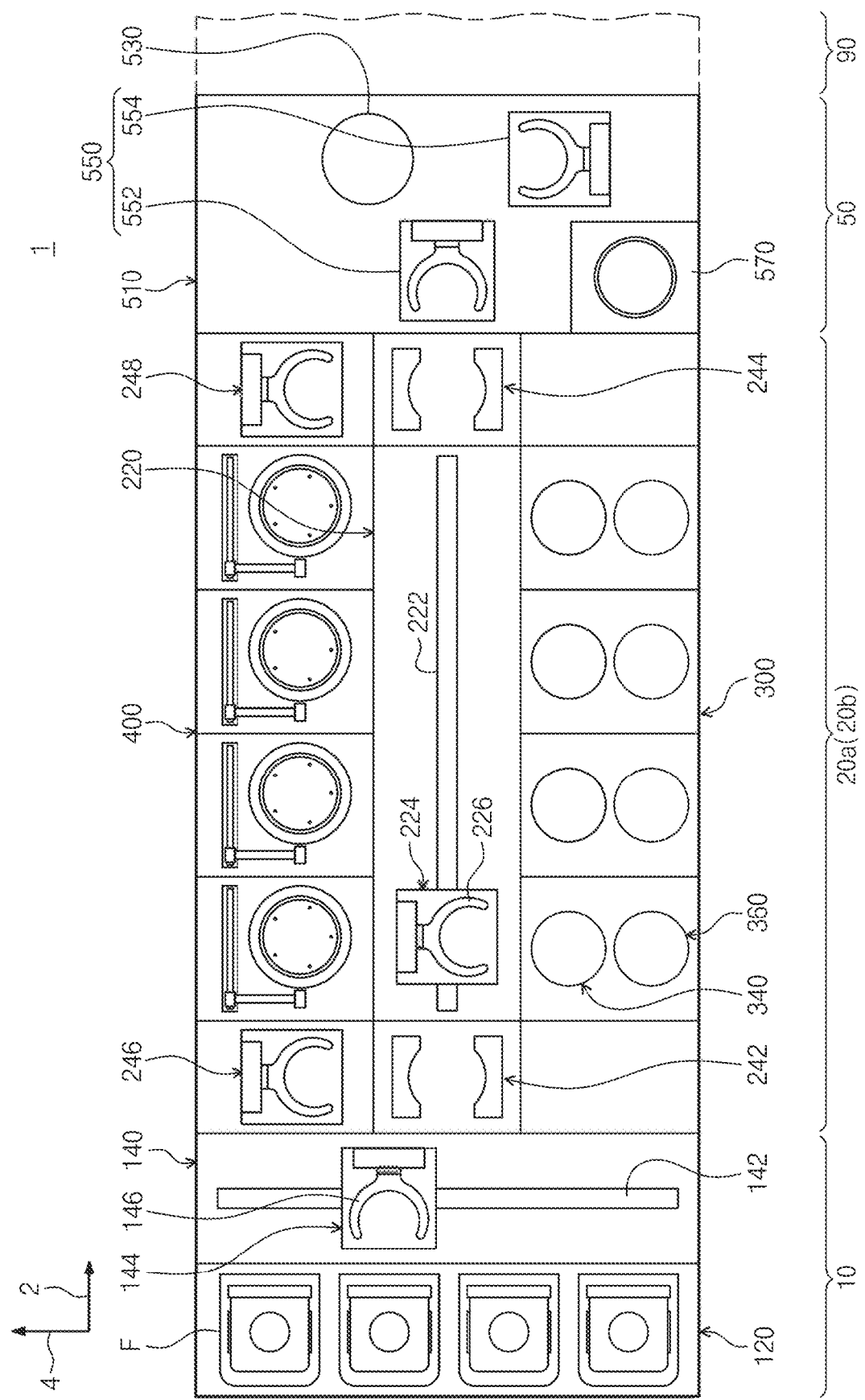
FIG. 3 is a plan view schematically illustrating the substrate treating apparatus of FIG. 1.
Figure 4:
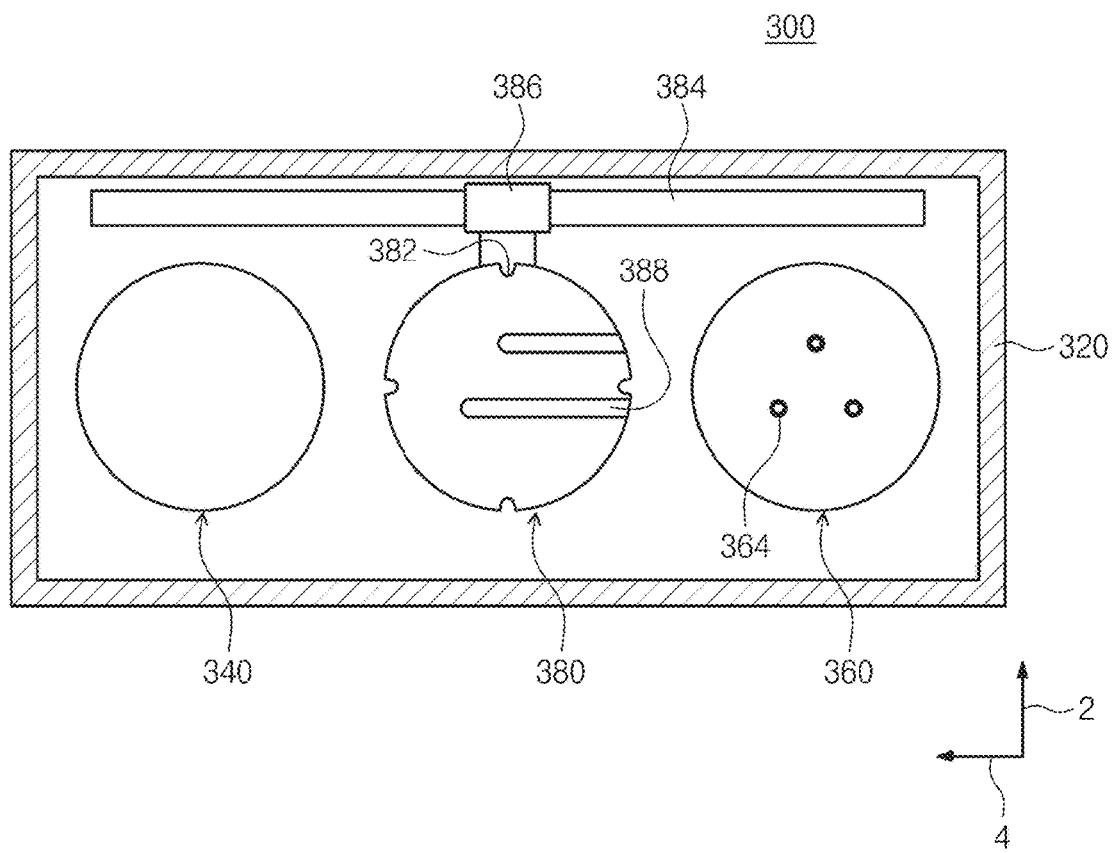
FIG. 4 is a plan view schematically illustrating a heat treating chamber.

FIG. 1 is a perspective view schematically illustrating a substrate treating apparatus according to an embodiment. FIG. 2 is a cross-sectional view schematically showing the coating block or developing block of FIG. 1. FIG. 3 is a plan view schematically showing the substrate treating apparatus of FIG. 1.

The substrate treating apparatus 1 may include an index module 10, a treating module 20, and an interface module 50.

The index module 10, the treating module 20, and the interface module 50 are in a direction and sequentially positioned. Hereinafter, a direction in which the index module 10, the treating module 20, and the interface module 50 are disposed is defined as a first direction 2. Also, when viewed from above, a direction perpendicular to the first direction 2 is defined as a second direction 4, and a direction perpendicular to a plane including both the first direction 2 and the second direction 4 is defined as a third direction 6. For example, the third direction 6 may be a direction perpendicular to the ground.

The index module 10 transfers the substrate between the container F and the treating module 20. More specifically, the index module 10 takes out the substrate from the container F and transfers the substrate which is taken out to the treating module 20 for treating the substrate. In addition, the index module 10 taken out the substrate on which a predetermined treatment has been completed from the treating module 20 and transfers the substrate to the container F. The index module 10 has a load port 120 and an index frame 140.

A container F in which the substrate is stored is accommodated in the load port 120. The load port 120 is disposed on an opposite side of the treating module 20 based on an index frame 140 to be described later. A plurality of load ports 120 may be provided, and the plurality of load ports 120 are positioned in a line along the second direction 4. The number of load ports 120 may increase or decrease according to a process efficiency or footprint conditions of the treating module 20.

The substrate is stored in the container F. As the container F stored in the load port 120 according to an embodiment, a sealing container such as a front opening unified pod (FOUP) may be used. The container F may be stored in the load port 120 by a means of transfer such as an overhead transfer, an overhead conveyor, or an automatic guided vehicle or by an operator.

The index frame 140 its lengthwise direction horizontal to the second direction 4. An index rail 142 and an index robot 144 are disposed inside the index frame 140. The index rail 142 its lengthwise direction parallel to the lengthwise direction of the index frame 140. The index robot 144 transfers the substrate. More specifically, the index robot 144 may transfer the substrate between the container F stored in the load port 120 and a front buffer 242 to be described later. The index robot 144 forwardly and backwardly moves on the index rail 142 along the lengthwise direction of the index rail 142.

The index robot 144 has an index hand 146. The substrate is placed on the index hand 146. The index hand 146 forwardly and backwardly moves, rotates about the third direction 6, and moves up and down along the third direction 6.

The treating module 20 perform a coating process and/or a developing process on the substrate. According to an embodiment, the treating module 20 may include a coating block 20*a* and a developing block 20*b*. The coating block 20*a* performs the coating process on the substrate. The developing block 20*b* performs a developing process on the substrate.

A plurality of coating blocks 20*a* and a plurality of developing blocks 20*b* may be provided, and the plurality of coating blocks 20*a* and the plurality of developing blocks 20*b* may be disposed to be stacked on each other. According to an embodiment, the coating blocks 20*a* may be disposed below the developing blocks 20*b*. In addition, each of the coating blocks 20*a* has the same or similar structure, and may perform the same or similar process. In addition, each of the developing blocks 20*b* has the same or similar structure, and may perform the same or similar process. However, the inventive concept is not limited thereto, and each coating block 20*a* may perform different processes, and each developing block 20*b* may perform different processes. In addition, the number and arrangement of the coating blocks 20*a* and the number and arrangement of the developing blocks 20*b* may be variously changed.

Since the coating block 20*a* and the developing block 20*b* according to an embodiment are generally configured to have the same or similar structure and arrangement with each other, a description of the developing block 20*b* will be omitted hereinafter, and the coating block 20*a* will be mainly described to avoid repeated explanations.

The coating block 20*a* has a transfer chamber 220, buffer chambers 242 and 244, a heat treating chamber 300, and a liquid treating chamber 400.

The transfer chamber 220 has its lengthwise direction parallel to the first direction 2. A guide rail 222 having its lengthwise direction parallel to the first direction 2 and a transfer robot 224 are disposed in the transfer chamber 220. The transfer robot 224 transfers the substrate between the buffer chambers 242 and 244, the heat treating chamber 300, and the liquid treating chamber 400. The transfer robot 224 forwardly and backwardly moves along the lengthwise direction of the guide rail 222 on the guide rail 222. The transfer robot 224 has a transfer hand 226 on which the substrate is placed. Since the structure of the transfer hand 226 has the same or similar structure as that of the index hand 146 described above, a redundant description thereof will be omitted.

The buffer chambers 242 and 244 provide a space at which the substrate taken into the coating block 20*a* and a substrate taken out from the coating block 20*a* temporarily remain. A plurality of buffer chambers 242 and 244 may be provided. Some of the buffer chambers 242 and 244 are disposed between the index frame 140 and the transfer chamber 220. Hereinafter, these buffer chambers are defined as front buffers 242. In addition, another portion of the buffer chambers 242 and 244 are disposed between the transfer chamber 220 and the interface module 50 to be described later. Hereinafter, these buffer chambers are defined as rear buffers 244. A plurality of front buffers 242 may be provided, and the plurality of front buffers 242 may be stacked in a vertical direction. In addition, the plurality of rear buffers 244 may be provided, and the plurality of rear buffers 244 may be stacked in a vertical direction.

Each of the front buffer 242 and the rear buffer 244 temporarily stores a plurality of substrates. A substrate stored in the front buffer 242 is taken in or taken out by the index robot 144 and the transfer robot 224. In addition, a substrate stored in the rear buffer 244 is taken in or taken out by the transfer robot 224 and the first robot 552 to be described later.

The buffer robots 246 and 248 may be disposed on a side of the buffer chambers 242 and 244. According to an embodiment, a front buffer robot 246 may be disposed on a side of the front buffer 242, and a rear buffer robot 248 may be disposed on a side of the rear buffer 244. However, the inventive concept is not limited thereto, and buffer robots may be disposed on both sides of the front buffer 242 and the rear buffer 244, respectively.

The front buffer robot 246 transfers the substrate between the front buffers 242. More specifically, the front buffer robot 246 transfers the substrate between the front buffers 242 arranged to be stacked while moving along the third direction 6. In addition, the rear buffer robot 248 transfers the substrate between the rear buffers 244 arranged to be stacked while moving along the third direction 6.

The heat treating chamber 300 performs a heat treatment process to adjust a temperature of the substrate. The heat treatment process according to an embodiment may include a cooling process of lowering a temperature of the substrate and a heating process of increasing the temperature of the substrate. A plurality of heat treating chambers 300 may be provided. The heat treating chambers 300 are disposed along the first direction 2. In addition, the heat treating chambers 300 are arranged to be stacked in the third direction 6. The heat treating chambers 300 are positioned on a side of the transfer chamber 220.

The liquid treating chamber 400 performs a liquid treatment process of supplying a liquid on the substrate. A plurality of liquid treating chambers 400 may be provided. The liquid treating chambers 400 are disposed along the first direction 2. In addition, the liquid treating chambers 400 are arranged to be stacked in the third direction 6. The liquid treating chambers 400 are positioned on the other side of the transfer chamber 200. That is, the heat treating chamber 300 and the liquid treating chamber 400 are disposed to face each other based on the transfer chamber 220.

Figure 5:
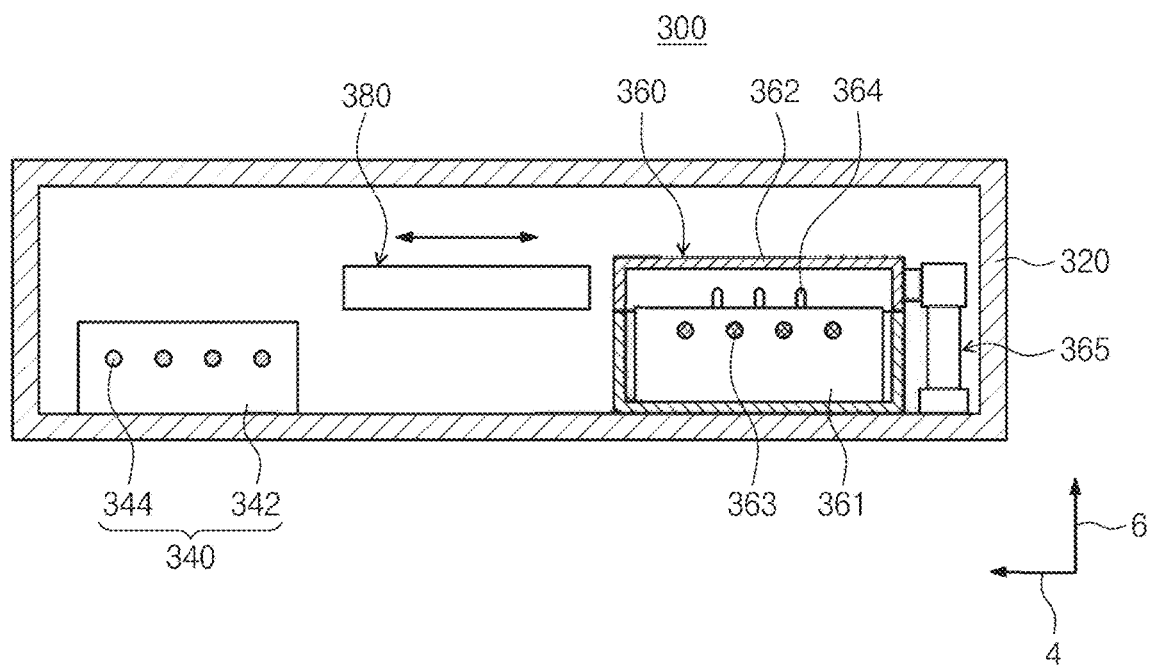
FIG. 5 is a front view schematically illustrating the heat treating chamber according to an embodiment.
Figure 6:
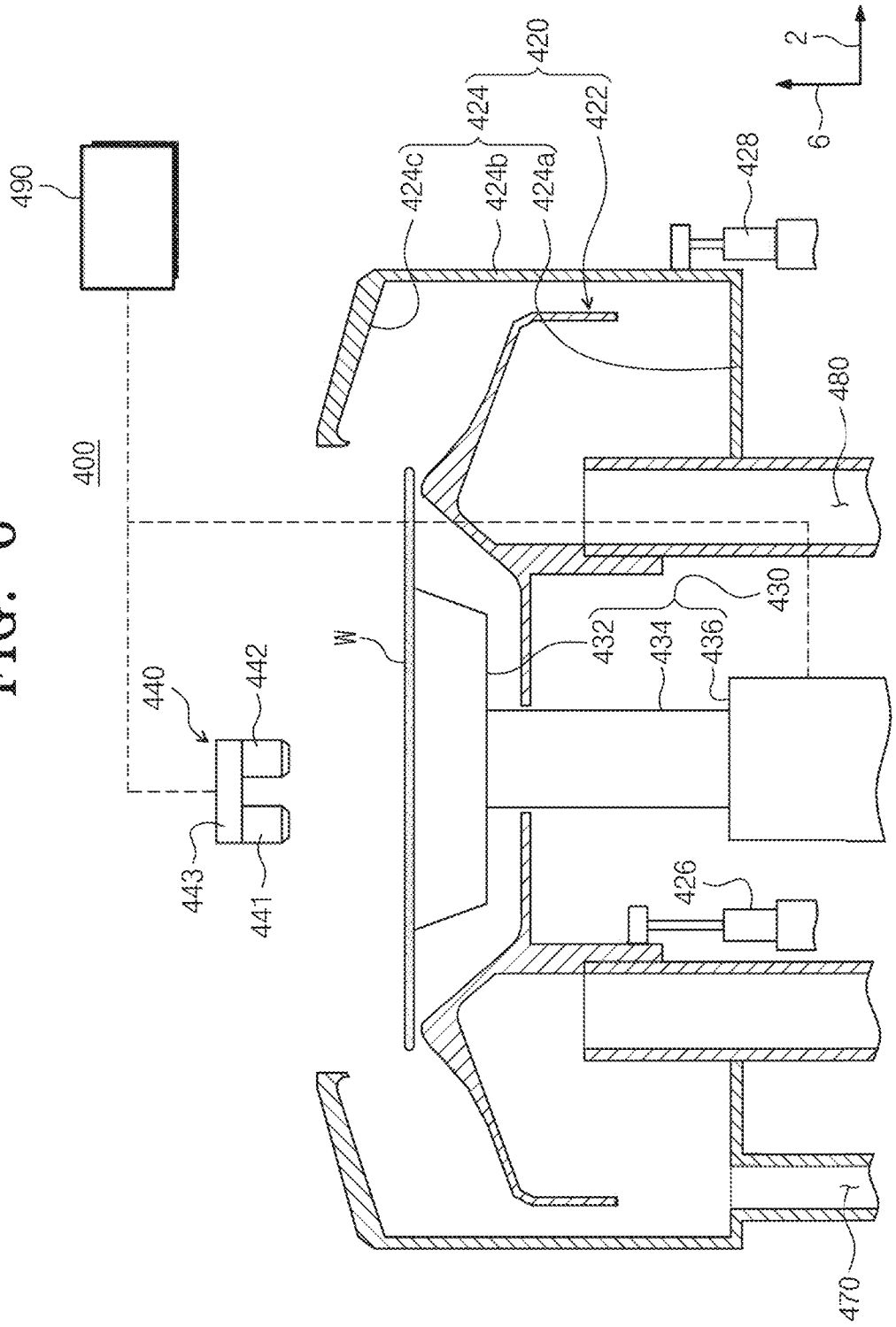
FIG. 6 is a cross-sectional view schematically illustrating a liquid treating chamber according to an embodiment.

FIG. 5 is a plan view schematically illustrating a heat treating chamber according to an embodiment. FIG. 6 is a front view schematically illustrating a heat treating chamber according to an embodiment.

The heat treating chamber 300 includes a housing 320, a cooling unit 340, a heating unit 360, and a transfer plate 380.

The housing 320 has a generally rectangular parallelepiped shape. Also, the housing 320 has an inner space. An entrance (not shown) through which the substrate enters and exits is formed on the sidewall of the housing 320. A cooling unit 340, a heating unit 360, and a transfer plate 380 are positioned in an inner space of the housing 320. The cooling unit 340 and the heating unit 360 are positioned side by side in the second direction 4.

According to an embodiment, the cooling unit 340 may be positioned closer to the transfer chamber 220 than the heating unit 360. The cooling unit 340 includes a cooling plate 342 and a cooling fluid channel 344. The cooling plate 342 may have a substantially circular shape when viewed from above. The cooling fluid channel 344 is positioned inside the cooling plate 342. A cooling fluid may flow through the cooling fluid channel 344. The cooling fluid may flow within the cooling fluid channel 344 to lower a temperature of the cooling plate 342.

The heating unit 360 may include a heating plate 361, a cover 362, and a heater 363.

The heating plate 361 may have a circular shape when viewed from above. The heating plate 361 may have a diameter larger than that of the substrate. A heater 363 is disposed inside the heating plate 361. The heater 363 may be any one of known heating element which generate a heat by resisting a current.

A plurality of lifting/lowering pins 364 moving up and down along the third direction 6 are disposed on the heating plate 361. The lifting/lowering pins 364 may receive the substrate from a transfer means (e.g., transfer plate 380) outside the heating unit 360, and transfer the substrate to the heating plate 361. In addition, the lifting/lowering pins 364 may lift the substrate from the heating plate 361 and transfer the substrate to a transfer means outside the heating unit 360.

The cover 362 has a shape in which a bottom portion is opened. The cover 362 is positioned above the heating plate 361 and can be moved in the vertical direction by the driver 365 coupled to the cover 362. The driver 365 may be any one of known motors which transfer a driving force. If the cover 362 is downwardly moved by the driver 365, a closed space may be formed by combining the cover 362 and the heating plate 361. The space which is formed by a combination of the cover 362 and the heating plate 361 may function as a heating space for heating the substrate.

The transfer plate 380 generally has a disk shape. In addition, the transfer plate 380 may have a diameter corresponding to the substrate. A notch 382 is formed at an edge of the transfer plate 380. In addition, a plate driver 386 may be coupled to the transfer plate 380. The plate driver 386 is mounted on the rail 384 having a lengthwise direction horizontal to the second direction 4. Accordingly, the transfer plate 380 may be linearly moved along the rail 384 by the plate driver 386.

In addition, a plurality of slit-shaped guide grooves 388 are formed in the transfer plate 380. The guide groove 388 extends from an end of the transfer plate 380 to an inside of the transfer plate 380. The guide groove 388 has a lengthwise direction horizontal to the second direction 4, and the plurality of guide grooves 388 are formed to be spaced apart along the first direction 2. If the substrate is taken over and handed over between the transfer plate 380 and the heating unit 360, the transfer plate 380 and the pin 364 can be prevented from interfering with each other by the guide groove 388 formed in the transfer plate 380.

The transfer plate 380 transfers the substrate to the pin 364, and the pin 364 downwardly moves to mount the substrate on the heating plate 361. A temperature of the substrate mounted on the heating plate 361 may be increased by a heat generation of the heater 363. In addition, the transfer plate 380 may be in contact with the cooling plate 342. More specifically, if the substrate is placed on a top side of the transfer plate 380, the transfer plate 380 may contact the cooling plate 342. The temperature of the substrate mounted on the transfer plate 380 may be lowered by a cooling fluid flowing through the cooling fluid channel 344.

In addition, according to an embodiment, the heating unit 360 provided in some of the plurality of heat treating chambers 300 may improve an adhesion rate of the photoresist liquid to the substrate by supplying a gas while heating the substrate. According to an embodiment, the gas may be a hexamethyldisilane.

FIG. 6 is a cross-sectional view schematically illustrating a liquid treating chamber according to an embodiment.

The liquid treating chamber 400 may include a treating container 420, a support unit 430, a liquid supply unit 440, and a controller 490.

The treating container 420, the support unit 430, and the liquid supply unit 440 may be disposed within a rectangular parallelepiped-shaped housing, which is not shown. In addition, an entrance through which the substrate W is taken in and out is formed on a sidewall of the housing (not shown). In addition, a fan filter unit for supplying an airflow to an inside of the housing (not shown) may be installed on a top wall of the housing (not shown), and a hole for exhausting an inner atmosphere of the housing (not shown) may be formed on a bottom wall of the housing (not shown).

The treating container 420 has a cup shape with an open top portion. An inside of the treating container 420 functions as a treating space in which the substrate W is treated. The treating space may function as a space in which the support unit 430 to be described later supports and rotates the substrate W. In addition, the treating space may function as a space in which the liquid supply unit 440 to be described later supplies a liquid to the substrate W to treat the substrate W.

The treating container 420 may include an inner cup 422 and an outer cup 424.

The inner cup 422 is positioned within inside the outer cup 424. The inner cup 422 may surround a chuck 432 to be described later. In addition, the inner cup 422 may have a disk shape surrounding the rotation shaft 434 to be described later.

The inner cup 422 may have an inner portion and an outer portion. The top surfaces of each of the inner portion and the outer portion may have different angles with respect to a virtual horizontal line. According to an embodiment, the inner portion may be positioned in a region overlapping the chuck 432 to be described later when viewed from above. In addition, the top surface of the inner portion may be upwardly inclined as it moves away from the rotation shaft 434.

The outer portion outwardly extends from the inner portion. According to an embodiment, the top surface of the outer portion may be downwardly inclined as the outer portion moves away from the rotation shaft 434. The top end of the inner portion may be positioned to overlap a side end of the substrate W when viewed from above. That is, the top end of the inner portion may coincide with the side end of the substrate W in the vertical direction. According to an embodiment, a point at which the inner portion and the outer portion meet may be a position lower than the top end of the inner part. In addition, a point at which the inner portion and the outer portion meets may be formed to be rounded. A space between the outer portion and the outer cup 424 functions as a recollecting path through which a liquid introduced into the treating space is recollected.

In addition, the inner cup 422 may be disposed to overlap the exhaust line 480 when viewed from above. A pump (not shown) is installed in the exhaust line 480. The pump (not shown) may apply a negative pressure to a space between the outer portion and the outer cup 424 through the exhaust line 480. That is, an inner atmosphere of the treating container 420 may be exhausted through the exhaust line 480, and an outer atmosphere of the treating container 420 may be exhausted through a hole (not shown) formed in a lower wall of the housing (not shown).

The outer cup 424 may have a shape surrounding the inner cup 422. The outer cup 424 has a bottom portion 424a, a side portion 424*b*, and an inclined portion 424*c*. The bottom portion 424*a* may be formed in a disk shape having a hollow. A recollecting line 470 is connected to the bottom portion 424*a*. The recollecting line 470 recollects a liquid supplied on the substrate W. The liquid recollected by the recollecting line 470 may be reused by an outer regeneration system (not shown).

The side portion 424*b* and the inclined portion 424*c* may have a substantially ring shape. The side portion 424*b* upwardly extends from an end of the bottom portion 424*a*. The inclined portion 424*c* extends from the top end of the side portion 424*b*. For example, the inclined portion 424*c* may extend from the top end of the side portion 424*b* toward a central axis of the rotation shaft 434 to be described later. In addition, the inclined portion 424*c* may be upwardly inclined with respect to the ground toward the central axis of the rotation shaft 434.

An inner lifting/lowering unit 426 is coupled to the inner cup 422. In addition, an outer lifting/lowering unit 428 is coupled to the outer cup 424. The inner lifting/lowering unit 426 may lift/lower the inner cup 422. In addition, the outer lifting/lowering unit 428 may lift/lower the outer cup 424. The inner lifting/lowering unit 426 and the outer lifting/lowering unit 428 may be any one of known motors which transmit a driving force, respectively. According to an embodiment, while treating the substrate W, the outer lifting/lowering unit 428 may upwardly move the outer cup 424. Accordingly, a top end of the inclined portion 424*c* may be positioned higher than a top surface of the substrate W supported by the support unit 430 while treating the substrate W. On the contrary, after the treating of the substrate W is completed, the outer lifting/lowering unit 428 may downwardly move the outer cup 424 so that the top end of the inclined portion 424*c* is positioned lower than the top surface of the substrate W supported by the support unit 430.

The support unit 430 supports and rotates the substrate W. The support unit 430 may include a chuck 432, a rotation shaft 434, and a rotation driver 436.

The substrate W is seated on a top surface of the chuck 432. If viewed from above, the top surface of the chuck 432 has a substantially circular shape. In addition, the top surface of the chuck 432 may have a diameter smaller than that of the substrate W. The rotation shaft 434 is coupled to a bottom end of the chuck 432. The rotation shaft 434 has a lengthwise direction parallel to the third direction 6. The rotation shaft 434 may rotate by receiving a power from the rotation driver 436. According to an embodiment, the rotation driver 436 may be a rotation motor capable of transmitting a rotational force to the rotation shaft 434. In addition, the rotation driver 436 may be a rotation motor capable of varying a rotation speed of the rotation shaft 434. As the rotation shaft 434 is rotated by the rotation driver 436, the substrate W may also rotate with the axial direction of the rotation shaft 434 as the center axis.

The liquid supply unit 440 supplies a liquid to the substrate W supported by the support unit 430. The liquid according to an embodiment may include a first liquid and a second liquid. According to an embodiment, the first liquid may be a different kind of liquid from the second liquid.

The first liquid according to an embodiment may be a liquid which changes a surface property of the substrate W. In addition, the first liquid may be a liquid which dilutes the second liquid. In addition, the first liquid may be a liquid which increases an adhesive force between the substrate W and the second liquid. That is, the first liquid may be a liquid which is supplied to the substrate W to pre-treat the substrate W. For example, the first liquid may be thinner.

The second liquid according to an embodiment may be a liquid which is sensitive to a specific light having a specific wavelength. In addition, the second liquid according to an embodiment may have hydrophobic properties. For example, the second solution may be a photosensitive solution such as a photoresist (PR).

The liquid supply unit 440 may include a first nozzle 441 and a second nozzle 442. The first nozzle 441 supplies the first liquid to the substrate W supported by the chuck 432. More specifically, the first nozzle 441 supplies the first liquid to a central region of a rotating substrate W. Also, the second nozzle supplies a second liquid to the substrate W supported on the chuck 432. More specifically, the second nozzle 442 supplies the second liquid to the central region of the rotating substrate W.

The first nozzle 441 and the second nozzle 442 is supported by the nozzle arm 443. The first nozzle 441 and the second nozzle 442 is installed at an end of the nozzle arm 443. The nozzle arm 443 may be coupled to a nozzle driver not shown and its position may be changed. For example, the nozzle driver (not shown) may rotate the nozzle arm 443 on a horizontal plane. In addition, the nozzle driver (not shown) may lift/lower the nozzle arm 443 in the third direction 6. However, the inventive concept is not limited thereto, and the nozzle driver (not shown) may move the nozzle arm 443 along a guide rail installed on a horizontal plane. In this case, a position of the nozzle arm 443 may be changed by forwardly and backwardly moving in the first direction 2 or the second direction 4.

As the position of the nozzle arm 443 is changed, a position of the first nozzle 441 and the second nozzle 442 is also changed, so that a position to which the liquid is supplied to the substrate W may be changed. For example, if the first nozzle 441 supplies the first liquid to the substrate W, the position of the first nozzle 441 may be changed so that the central region of the first nozzle 441 and the substrate W overlaps when viewed from above. Unlike this, if the second nozzle 442 supplies the second liquid to the substrate W, a position of the second nozzle 442 may be changed so the second nozzle 442 and the central region of the substrate W overlap.

Unlike the above-described example, the number of nozzles supplying the liquid to the substrate W may be variously changed. For example, the number of nozzles may be at least N or more (N is a natural number of 3 or more). Each of the nozzles may supply different liquids including the first liquid and the second liquid to the substrate W. In addition, some nozzles may supply the same liquid to the substrate W, but may supply a liquid having different composition ratios to the substrate W.

The controller 490 may control the rotation driver 436, the first nozzle 441, and the second nozzle 442. The controller 490 may comprise a process controller consisting of a microprocessor (computer) that executes a control of the rotation driver 436, the first nozzle 441, and the second nozzle 442, including a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory. A specific mechanism by which the controller 490 controls the rotation driver 436, the first nozzle 441, and the second nozzle 442 to treat the substrate W will be described later.

Referring back to FIG. 1 to FIG. 3, the interface module 50 connects the treating module 20 to an outer exposure apparatus 90. The interface module 50 includes an interface frame 510, an interface buffer 530, a transfer unit 550, and an additional process chamber 570.

The interface buffer 530, the transfer unit 550, and the additional process chamber 570 are positioned inside the interface frame 510. The interface buffer 530 provides a space in which the substrate is temporarily stored in a process of transferring the substrate between the coating block 20a, the additional process chamber 570, the exposure apparatus 90, and the developing block 20b. A plurality of interface buffers 530 may be provided, and the plurality of interface buffers 530 may be disposed to be stacked on each other.

The transfer unit 550 transfers the substrate between the coating block 20a, the additional process chamber 570, the exposure apparatus 90 or the developing block 20b. The transfer unit 550 includes at least one robot. According to an embodiment, the transfer unit 550 may include a first robot 552, a second robot 554, and a third robot (not shown).

The first robot 552 may transfer the substrate between the coating block 20a, the additional process chamber 570, and the exposure apparatus 90. More specifically, the first robot 552 may transfer the substrate between the rear buffer 244, the additional process chamber 570, and the exposure apparatus 90. In addition, the second robot 554 may transfer the substrate between the interface buffer 530 and the exposure apparatus 90. The third robot, which is not shown, may transfer the substrate between the interface buffer 530 and the developing block 20b. Each of the first robot 552, the second robot 554, and the third robot (not shown) may include a hand on which a substrate is placed. Each hand forwardly and backwardly moves, rotates around an axis parallel to the third direction 6, and vertically moves along the third direction 6.

The additional process chamber 570 may perform a predetermined additional process before the substrate which has completed a predetermined process at the coating block 20a is taken into the exposure apparatus 90. In addition, the additional process chamber 570 may perform a predetermined additional process before the substrate that has been treated by the exposure apparatus 90 is taken into the developing block 20b.

A plurality of additional process chambers 570 may be provided. In addition, the plurality of additional process chambers 570 may be disposed to be stacked on each other. All of the additional process chambers 570 may perform the same process. Selectively, the additional process chambers 570 may perform different processes. For example, in some of the plurality of additional process chambers 570, an additional process according to an embodiment be performing an edge exposure process of exposing an edge region of the substrate. In addition, in other parts of the plurality of additional process chambers 570, a top surface cleaning process of cleaning a top surface of the substrate may be performed. In addition, in another part of the plurality of additional process chambers 570, a bottom surface cleaning process of cleaning a bottom surface of the substrate may be performed.

Hereinafter, a substrate treating method according to an embodiment will be described. The substrate treating method described below may be performed by the substrate treating apparatus described with reference to FIG. 1 to FIG. 6. Accordingly, hereinafter, the substrate treating method according to an embodiment will be described by citing the reference numerals shown in FIG. 1 to FIG. 6. In addition, the substrate treating method described below can be performed by controlling the rotation driver 436, the first nozzle 441, and second nozzle 442 described above by the controller 490.

Figure 7:
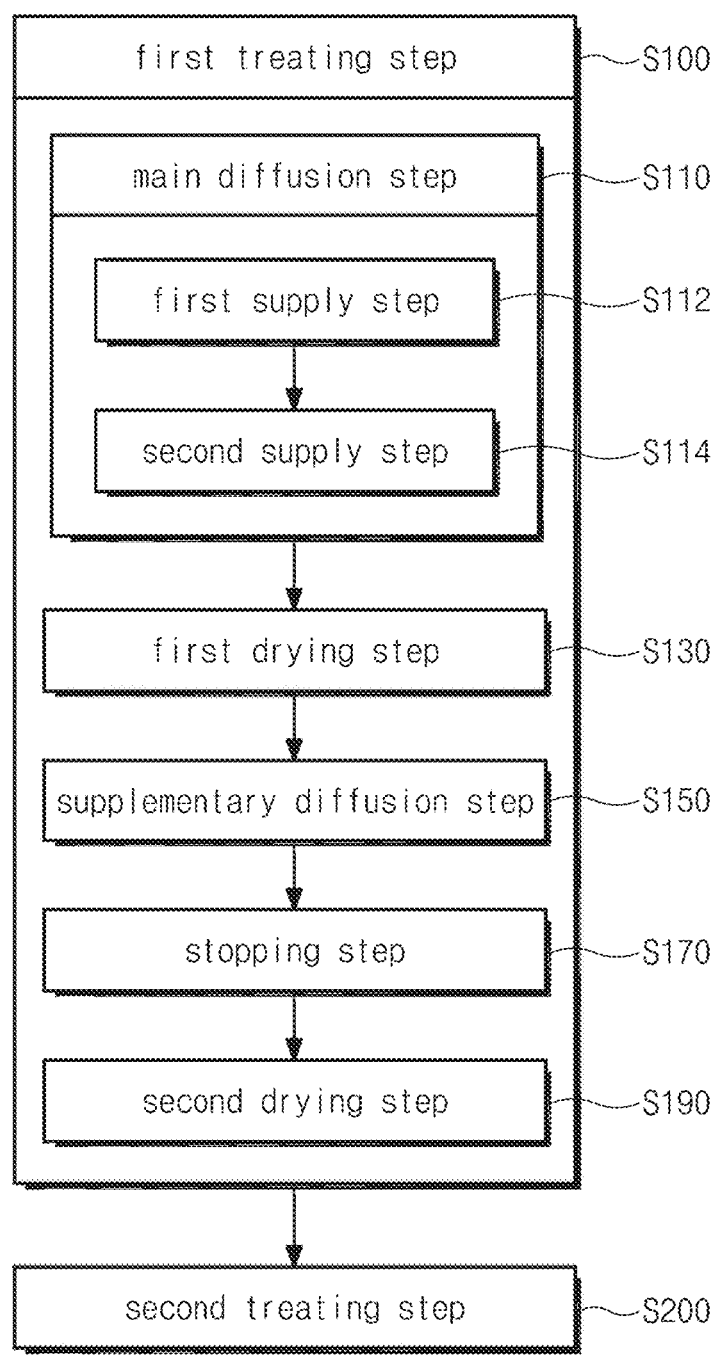
FIG. 7 is a flowchart of a substrate treating method according to an embodiment.
Figure 8:
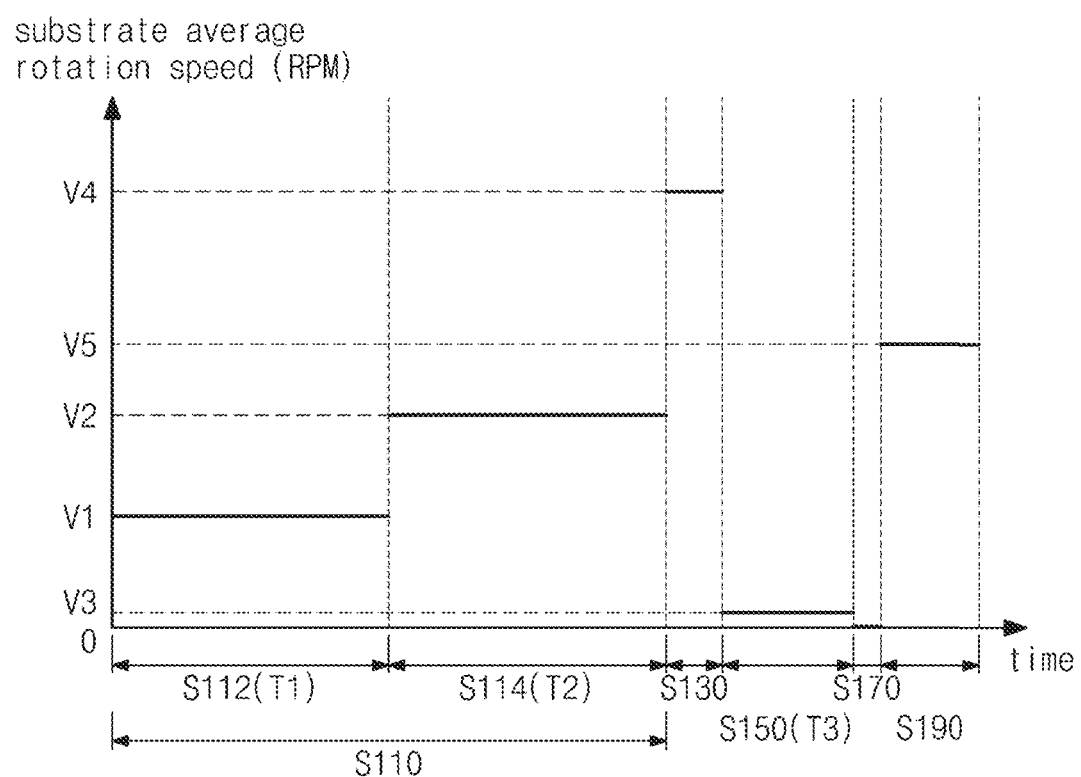
FIG. 8 is a graph illustrating an average rotation speed of the substrate at a first treating step according to an embodiment, FIG. 9 to FIG. 14 is an enlarged view illustrating a substrate on which the first treating step is performed according to an embodiment.

FIG. 7 is a flowchart of a substrate treating method according to an embodiment. FIG. 8 is a graph illustrating an average rotation speed of the substrate in a first treating step according to an embodiment.

The substrate treating method according to an embodiment includes a first treating step S100 and a second treating step S200.

The first treating step S100 and the second treating step S200 according to an embodiment may be performed in the order of time series. In the first treating step S100, the substrate W is treated by supplying a first liquid to the rotating substrate W. In addition, in the first treating step S100, a rotation speed of the substrate W may be changed in a process of supplying the first liquid to the rotating substrate W. A detailed description thereof will be described later.

In addition, in the second treating step S200, a second liquid is supplied to a rotating substrate W to treat the substrate W. In addition, in both the first treating step S100 and the second treating step S200, a liquid may be supplied to the top surface of the substrate W. The top surface of the substrate W according to an embodiment may be a surface on which a pattern is formed.

The first treating step S100 may include a main diffusion step S110, a first drying step S130, a supplementary diffusion step S150, a stopping step S170, and a second drying step S190. The main diffusion step S110, the first drying step S130, the supplementary diffusion step S150, the stopping step S170, and the second drying step S190 may be sequentially performed.

In the main diffusion step S110, the first liquid is supplied to the rotating substrate W. More specifically, in the main diffusion step S110, the first liquid is supplied to a central region of the rotating substrate W. The first liquid supplied to the substrate W is applied to an edge region of the substrate W by a centrifugal force.

The main diffusion step S110 may include a first supply step S112 and a second supply step S114. The first supply step S112 may be performed prior to the second supply step S114.

In the first supply step S112, the first liquid is supplied to the rotating substrate W. According to an embodiment, in the first supply step S112 the first liquid is supplied to a central region of the rotating substrate W. In addition, in the first supply step S112, the substrate W may rotate at a first rotation speed V1. A rotational speed described below may mean an average speed. The first rotation speed V1 according to an embodiment may be about 500 RPM (Revolutions per minute). In addition, the first supply step S112 according to an embodiment may be performed during a first time T1. That is, the first liquid may be supplied to the substrate W rotating at the first rotation speed V1 for the first time T1. For example, the first time T1 may be approximately 4 seconds.

In the second supply step S114, the first liquid is supplied to the central region of the rotating substrate W. According to an embodiment, in a process of changing from the first supply step S112 to the second supply step S114, the first liquid may be continuously supplied to the substrate W. In addition, in the second supply step S114 according to an embodiment, the substrate W may rotate at a second rotation speed V2. The second rotation speed V2 may be faster than the first rotation speed V1. The second rotation speed V2 according to an embodiment may be about 800 RPM. That is, in the process of changing from the first supply step S112 to the second supply step S114, the first liquid may continue to be supplied to the substrate, but the substrate W may be rotated faster. In addition, the second supply step S114 according to an embodiment may be performed during the second time T2. That is, the first liquid may be supplied to the substrate W rotating at the second rotation speed V2 for a second time T2. For example, the second time T2 may be approximately 4 seconds.

The first drying step S130 may be performed after the second supply step S114. In the first drying step S130, a first liquid remaining on the substrate W is removed from the substrate W by rotating the substrate W at high speed. In the first drying step S130 according to an embodiment, the substrate W may be rotated at a fourth rotation speed V4. The fourth rotation speed V4 may be faster than the first rotation speed V1 and the second rotation speed V2 described above. For example, the fourth rotation speed V4 may be about 2,000 RPM.

In the supplementary diffusion step S150, the first liquid is supplied again to the central region of the rotating substrate W. In the supplementary diffusion step S150 according to an embodiment, the substrate W may rotate at a third rotation speed V3. In the supplementary diffusion step S150, the rotation speed of the substrate W may be slower than the rotation speed of the substrate W in the main diffusion step S100, the first drying step S130, and the second drying step 190. That is, the third rotation speed V3 may be slower than the first rotation speed V1, the second rotation speed V2, and the fourth rotation speed V4. In addition, the third rotation speed V3 may be a speed slower than the fifth rotation speed V5 to be described later. For example, the third rotation speed V3 may be about 30 RPM.

In addition, the supplementary diffusion step S150 may be performed during a third time T3. More specifically, the first liquid may be supplied to the substrate W rotating at the third rotation speed V3 for the third time T3. According to an embodiment, the third time T3 may be shorter than the first time T1 and the second time T2 described above. For example, the third time T3 may be approximately 2 seconds.

In the stopping step S170, a rotation of the substrate W may be stopped. According to an embodiment, the substrate W may be maintained in a state in which a rotation thereof is stopped for approximately 0.8 seconds in the stopping step S170. In addition, in the stopping step S170, liquid may not be supplied to the substrate W.

The second drying step S190 may be performed after the stopping step S170. In the second drying step S190, the substrate W is rotated at high speed to dry the substrate W. In the second drying step S190 according to an embodiment, the substrate W may be rotated at a fifth rotation speed V5. The fifth rotation speed V5 may be faster than the first rotation speed V1, the second rotation speed V2, and the third rotation speed V3. In addition, the fifth rotation speed V5 may be slower than the fourth rotation speed V4 described above. For example, the fourth rotation speed V4 may be about 1000 RPM.

In the second treating step S200, the second liquid is supplied to the rotating substrate W. More specifically, in the second treating step S200, the second liquid is supplied to the central region of the rotating substrate W. The second liquid supplied to the central region of the substrate W can be uniformly applied to the entire region of the substrate W, including the central region and the edge region of the substrate W, by a centrifugal force.

An average rotation speed of the substrate is shown in FIG. 8 which has a graph for illustrating the rotation speed of the substrate in the first treating step according to an embodiment, but the rotation speed of the substrate W may be accelerated or decelerated in a process of moving from one step to another. In addition, the rotation speed of the substrate W may be move with uniformly acceleration or may move with uniformly deceleration in a process of moving to another step.

FIG. 9 to FIG. 14 are enlarged views schematically illustrating the substrate in which the first treating step is performed according to an embodiment.

Figure 9:
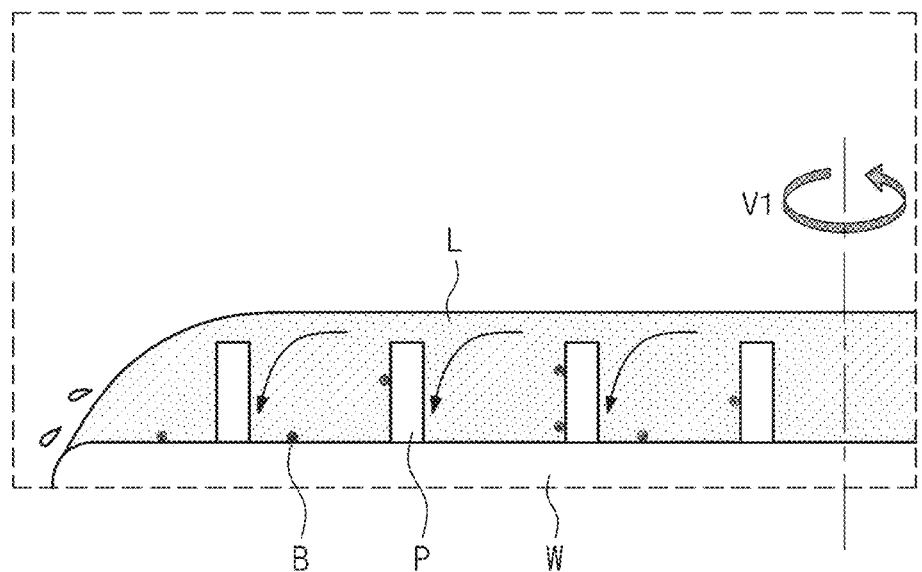

As shown in FIG. 9, in the first supply step S112 the first liquid L is supplied to the substrate W rotating at the first rotation speed V1. The first liquid L supplied to the central region of the substrate W flows to the edge region of the substrate W. In addition, the first liquid L supplied to the substrate W penetrates into a space between the patterns P formed on the substrate W. The first liquid L penetrating into the space between the patterns P may remove foreign substances B such as particles attached to the substrate W from the substrate W during a pre-treatment process.

Figure 10:
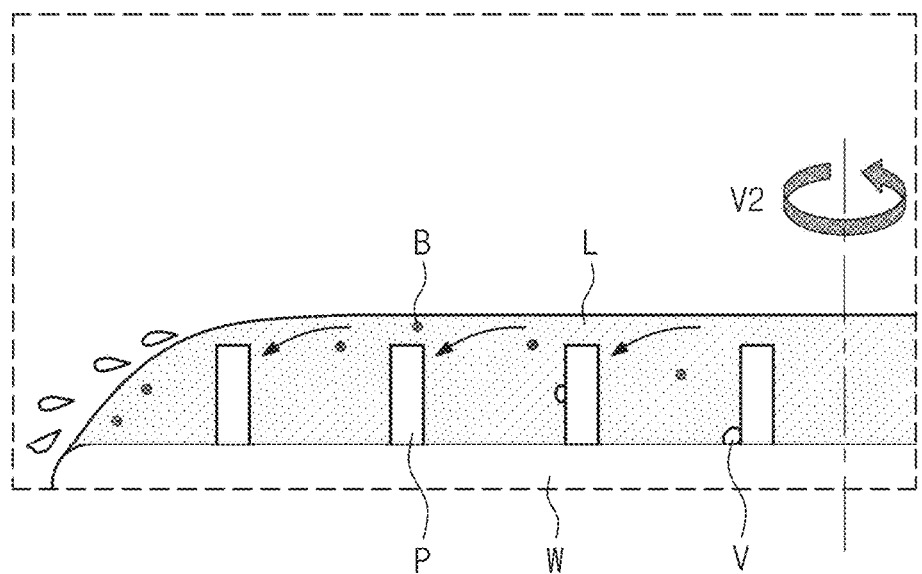

As shown in FIG. 10, in the second supply step S114, the first liquid L is supplied to the substrate W rotating at the second rotation speed V2. The first liquid L supplied to the central region of the substrate W flows to the edge region of the substrate W. In particular, since the rotation speed of the substrate W in the second supply step S114 is faster than the rotation speed of the substrate W in the first supply step S112, the first liquid L supplied to the substrate W may diffuse to the edge region of the substrate W. In addition, the first liquid L supplied to the substrate W may remove foreign substances B which are separated from the substrate W from the substrate W by the centrifugal force.

According to the above-described example, since the rotation speed of the substrate W in the first supply step S112 is slower than the rotation speed of the substrate W in the second supply step S114, the first liquid L supplied to the substrate W may penetrate more easily into the space between the patterns P. The foreign substances B attached to the space between the patterns P may be easily separated from the substrate W by the first liquid L penetrating into the space between the patterns P in the first supply step S112. In addition, the foreign substances B separated from the substrate W can be more easily removed from the substrate W by the centrifugal force of the substrate W rotating at a high speed in the second supply step S114. Furthermore, by rotating the substrate W faster in the second supply step S114, the first liquid L may be uniformly applied over the entire region of the substrate W including the central region and the edge region of the substrate W. That is, the first liquid L may be uniformly applied to the entire surface of the substrate W on which the pattern P is formed.

In the second supply step S114 according to an embodiment, the rotation speed of the substrate W may be relatively faster than the rotation speed of the substrate W in the first supply step S112. If the first liquid L is supplied to the substrate W rotating at such a high speed, the first liquid L tends to flow in a direction by a high centrifugal force. Accordingly, the first liquid L supplied to the substrate W may penetrate intensively only in some spaces facing the direction in which the first liquid L flows among the spaces between the patterns P. As shown in FIG. 10, an air may be trapped in another space between the spaces between the patterns P in which the first liquid L does not easily penetrate, thereby forming an air void V.

Figure 11:
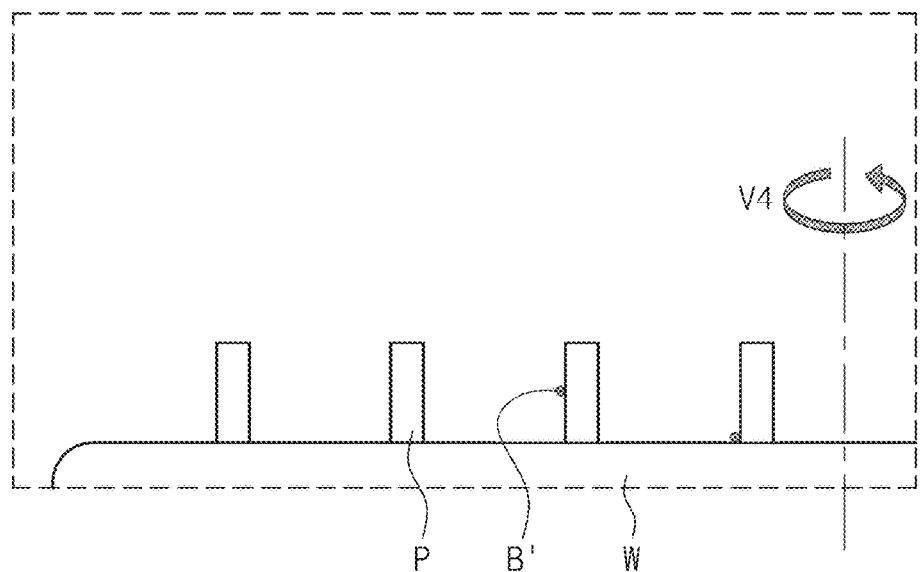

As illustrated in FIG. 11, in the first drying step S130, a first liquid remaining on the substrate W is removed among a first liquid supplied to the substrate W in the first supply step S112 and the second supply step S114. In the first drying step S130, the substrate W is rotated at a fourth rotation speed V4. In the first drying step S130, the substrate W may be rotated at a speed faster than the rotation speed of the substrate W in the second supply step S114. The first liquid remaining on the substrate W is removed from the substrate W by the centrifugal force, and thus the substrate W may be dried.

In the process of performing the first drying step S130, the air void formed in the space between the patterns P may be transformed into a foreign substance source B' such as a stain. Such a foreign substance source B' acts as a factor which weakens an adhesive force between the substrate W and the second liquid in the subsequent second liquid supply step S200. In addition, the foreign substance source B' acts as a factor which prevents the second liquid from being uniformly coated on the substrate W in the subsequent second liquid supply step S200. In addition, the foreign substance source B' acts as a factor which makes it impossible to uniformly process the substrate W in a subsequent exposing process.

Figure 12:
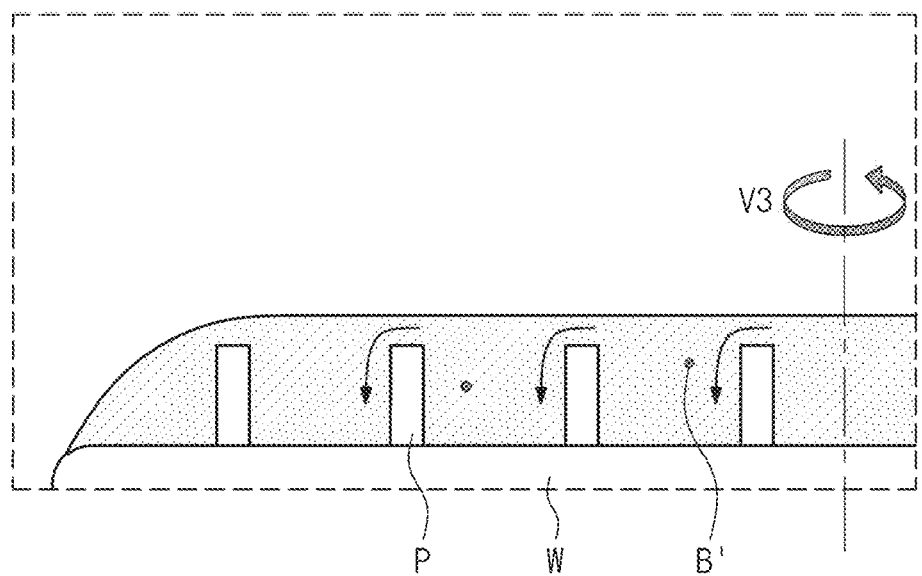

Accordingly, as shown in FIG. 12, in the supplementary diffusion step S150, the first liquid L is supplemented and supplied to the central region of the substrate W rotating at the third rotation speed V3. As described above, the rotation speed of the substrate W in the supplementary diffusion step S150 is slower than the rotation speed of the substrate W in the first supply step S112 and the second supply step S114. Accordingly, in the supplementary diffusion step S150, the first liquid L may penetrate very easily into the space between the patterns P. Accordingly, the first liquid L may be uniformly filled in the space between the patterns P. In the second supply step S114, the foreign substance source B' which may be formed in the space between the patterns P due to the high rotational speed of the substrate W may be completely removed by the first liquid L filled in the space between in the supplementary diffusion step S150.

Figure 13:
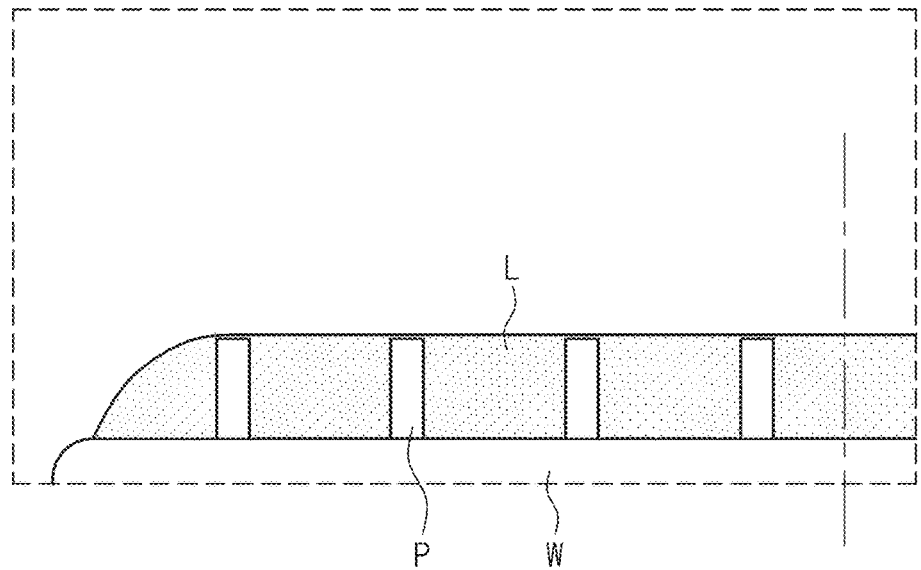

As shown in FIG. 13, in the stopping step S170, the rotation of the substrate W may be stopped. As the rotation of the substrate W stops for a certain period of time, a time for the first liquid L supplied to the substrate W in the supplementary diffusion step S150 to penetrate into the space between the patterns P may be secured. In particular, since the first liquid L is supplied to the central region of the substrate W, it is meaningful to secure enough time for the first liquid L to penetrate into the space between the patterns P in the edge region of the substrate W by performing the stopping step S170.

Figure 14:
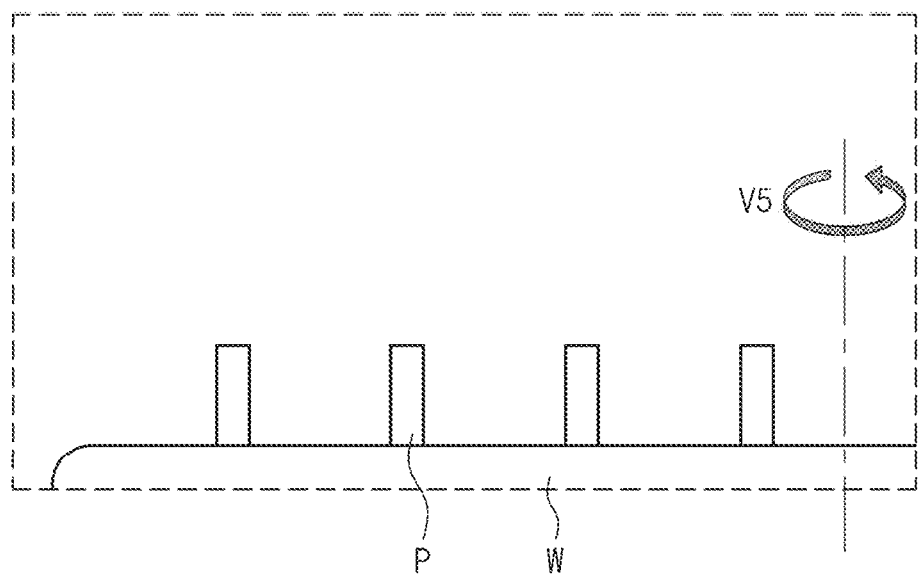

As illustrated in FIG. 14, in the second drying step S190, a first liquid remaining in the substrate W among the first liquid supplied to the substrate W in the supplementary diffusion step S150 while rotating the substrate W is removed by the centrifugal force. In addition, in the second drying step S190, the substrate W is rotated at a fifth rotation speed V5. That is, the rotation speed of the substrate W in the second drying step S190 may be relatively slower than the rotation speed of the substrate W in the first drying step S130. This is due to a difference in an amount of the first liquid remaining on the substrate W, since a time for supplying the first liquid to the substrate W in the supplementary diffusion step S150 according to an embodiment is less than a time for supplying the first liquid to the substrate W in the first supply step S112 and the second supply step S114. That is, the substrate W may be efficiently treated by varying the drying time according to the amount of the first liquid supplied to the substrate W.

According to an embodiment of the inventive concept described above, the first liquid uniformly penetrates between patterns so that the first liquid may be uniformly applied to the entire region of the substrate. Accordingly, in the subsequent second treating step S200, the adhesive force between the substrate W and the second liquid may be increased. In addition, the reactivity between the substrate W and the second liquid having hydrophobic properties in the second treating step S200 may be improved. In addition, the concentration of the second liquid according to the recipe may be easily adjusted in the second treating step S200. In addition, voids that can be a source of particles can be reliably removed from the substrate W in the subsequent process.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:
1. A substrate treating method comprising:
   first treating including supplying a first liquid to a rotating substrate; and
   second treating including supplying a second liquid to the rotating substrate after the supplying of the first liquid,
   wherein the first treating includes,
   a main diffusing including main supplying the first liquid to the rotating substrate to coat a whole area of the substrate with the first liquid and to remove particles attached on the substrate,
   subsequently a first drying including stopping supplying of the first liquid to the rotating the substrate, and
   subsequently a supplementary diffusing including supplementary supplying the first liquid to the rotating substrate to fill a space between patterns formed on the substrate,
   wherein in the main diffusing, a rotation speed of the substrate is increased during the supplying of the first liquid to the rotating substrate, and
   in the first drying, the rotation speed is increased from a highest speed of the main diffusing.

2. The substrate treating method of claim 1, wherein a first average rotation speed of the substrate at the supplementary diffusing is slower than a second average rotation speed of the substrate at the main diffusing.

3. The substrate treating method of claim 2, wherein the main supplying of the first liquid of the main diffusing includes:
   firstly supplying the first liquid to the rotating substrate which is rotating at a first rotation speed; and secondly supplying the first liquid to the rotating substrate which is rotating at a second rotation speed, the second rotation speed being greater than the first rotation speed.

4. The substrate treating method of claim 3, wherein each supply time of the first liquid to the substrate at the first supplying and the second supplying is longer than a supply time of the first liquid to the substrate at the supplementary diffusing.

5. The substrate treating method of claim 3, wherein each of the first rotation speed and the second rotation speed is faster than the average rotation speed of the substrate at the supplementary diffusing.

6. The substrate treating method of claim 5, wherein the first treating further includes:
   stopping the rotating of the substrate after the supplementary diffusing; and
   secondly drying including drying the first liquid remaining on the substrate after the stopping of the rotating of the substrate.

7. The substrate treating method of claim 6, wherein each average rotation speed of the substrate at the first drying and the second drying is greater than the first rotation speed and the second rotation speed, and
   wherein the average rotation speed of the substrate at the first drying is greater than the average rotation speed of the substrate at the second drying.

8. The substrate treating method of claim 1, wherein the first liquid is a thinner, and the second liquid is a photoresist liquid.

9. The substrate treating method of claim 1, wherein each of the first liquid and the second liquid is supplied to a top surface of the substrate having a pattern formed thereon, and
   each of the first liquid and the second liquid is each supplied to a central region of the substrate.

10. A substrate treating method for treating a substrate having patterns formed on a top surface thereof, the substrate treating method comprising:
    first supplying a first liquid to a rotating substrate to permeate the first liquid to a space between patterns;
    second supplying the first liquid to the rotating substrate to diffuse the first liquid toward an edge region of the substrate;
    after the second supplying, first drying including stopping the supply of the first liquid to the rotating substrate and rotating the substrate at a rotation speed greater than a rotation speed during the second supplying; and
    after the second supplying, supplementary diffusing including supplying the first liquid to the rotating substrate to secondly permeate the first liquid to the space between patterns, and
    wherein an average rotation speed of the substrate at the first supplying of the first liquid, a first average rotation speed of the substrate at the second supplying of the first liquid, and a second average rotation speed of the substrate at the supplementary diffusing are different from one another.

11. The substrate treating method of claim 10, wherein a rotation speed of the substrate is changed while the first liquid is continuously supplied to the substrate, in a transition from the first supplying of the first liquid to the second supplying of the first liquid.

12. The substrate treating method of claim 11, wherein the substrate rotates at a first rotation speed at the firstly supplying of the first liquid, and
    the substrate rotates at a second rotation speed at the second supplying of the first liquid, and
    the first rotation speed is lower than the second rotation speed.

13. The substrate treating method of claim 12, wherein the substrate rotates at a third rotation speed at the supplementary diffusing, and
    the third rotation speed is lower than the first rotation speed.

14. The substrate treating method of claim 13, wherein the first rotation speed is about 500 RPM, and
    the second rotation speed is about 800 RPM, and
    the third rotation speed is about 30 RPM.

15. The substrate treating method of claim 10, wherein the first liquid includes a thinner.

16. A substrate treating method comprising:
    first supplying a first treatment liquid to a rotating substrate for a first time, the rotating substrate rotating at a first rotation speed;
    subsequently second supplying the first treatment liquid to the rotating substrate for a second time approximately equal to the first time, the rotating substrate rotating at a second rotation speed greater than the first rotation speed;
    subsequently first drying including stopping the supply of the first treatment liquid to the rotating substrate for a third time less than the first time, the rotating substrate rotating at a third rotation speed greater than the second rotation speed;
    subsequently supplementary diffusing including resupplying the first treatment liquid to the rotating substrate for a fourth time greater than the third time and less than the first time, the rotating substrate rotating at a fourth rotation speed less than the first rotation speed;
    subsequently stopping rotating of the rotating substrate and stopping the resupplying the first treatment liquid for a fifth time, the fifth time less than the third time; and
    subsequently restarting rotating of the substrate to rotate the substrate at a fifth rotation speed and not supplying the first treatment liquid for a sixth time, the rotating of the substrate at the fifth rotation speed greater than the second rotation speed and less than the third rotation speed.

17. The method of claim 16, wherein
    the first and second time are 4 seconds,
    the fourth time is 2 seconds, and
    the fifth time is 0.8 seconds.

18. The method of claim 16 wherein
    the first rotation speed is 500 rotations per minute (RPM),
    the second rotation speed is 800 RPM,
    the third rotation speed is 2,000 RPM,
    the fourth rotation speed is 30 RPM, and
    the fifth rotation speed is 1000 RPM.

19. The method of claim 18, wherein
    the first and second time are 4 seconds,
    the fourth time is 2 seconds, and
    the fifth time is 0.8 seconds.

* * * * *